(12) United States Patent
Min et al.

(10) Patent No.: US 11,114,145 B2
(45) Date of Patent: Sep. 7, 2021

(54) THREE-DIMENSIONAL MAGNETIC DEVICE AND MAGNETIC MEMORY

(71) Applicant: XI'AN JIAOTONG UNIVERSITY, Xi'an (CN)

(72) Inventors: Tai Min, San Jose, CA (US); Runzi Hao, Xi'an (CN); Lei Wang, Xi'an (CN); Xue Zhou, Xi'an (CN)

(73) Assignee: Xi'an Jiaotong University, Xi'an (CN)

( * ) Notice: Subject to any disclaimer, the term of this patent is extended or adjusted under 35 U.S.C. 154(b) by 0 days.

(21) Appl. No.: 16/845,593

(22) Filed: Apr. 10, 2020

(65) Prior Publication Data
US 2021/0005235 A1 Jan. 7, 2021

(30) Foreign Application Priority Data
Jul. 4, 2019 (CN) .......................... 201910600144.3

(51) Int. Cl.
| | |
|---|---|
| *G11C 11/00* | (2006.01) |
| *G11C 11/16* | (2006.01) |
| *G11C 11/18* | (2006.01) |
| *H01L 43/04* | (2006.01) |
| *H01L 43/10* | (2006.01) |

(52) U.S. Cl.
CPC ........ *G11C 11/161* (2013.01); *G11C 11/1673* (2013.01); *G11C 11/1675* (2013.01); *G11C 11/18* (2013.01); *H01L 43/04* (2013.01); *H01L 43/10* (2013.01)

(58) Field of Classification Search
CPC .................................................. G11C 11/161

USPC .......................................................... 365/158
See application file for complete search history.

(56) References Cited

U.S. PATENT DOCUMENTS

2019/0036013 A1* 1/2019 Mo ........................ G11C 11/161

OTHER PUBLICATIONS

L. Liu et al., Science, vol. 336, No. 6081, p. 555-558, 2012.
(Continued)

*Primary Examiner* — Hoai V Ho
(74) *Attorney, Agent, or Firm* — Venable LLP

(57) ABSTRACT

Disclosed is a three-dimensional magnetic device based on a spin Hall effect which includes an internal electrode, at least one magnetic junction and at least one external electrode. The internal electrode, the at least one magnetic junction and the at least one external electrode have columnar structures. Each of the at least one magnetic junction comprises a magnetic free layer, a magnetic reference layer and a non-magnetic spacing layer between magnetic free layer and magnetic reference layer. The magnetic free layer is in contact with internal electrode, and the magnetic reference layer in each of the at least one magnetic junction is in contact with a corresponding one of the at least one external electrode. The three-dimensional magnetic device may be stacked in a normal direction of the bottom surface of the internal electrode. Magnetization reversal of three-dimensional magnetic device may be realized by a combination of a spin-orbit torque and a spin transfer torque. The magnetic device has advantages of reduced heating, improved reliability and stability, high storage density while ensuring thermal stability.

9 Claims, 10 Drawing Sheets

(56) References Cited

OTHER PUBLICATIONS

Q. Shao et al., 2018 IEEE Int. Electron. Devices Meet., p. 36.3.1-36.3.4, 2018.
A.V Khvalkovskiy et al., J. Phys. D. Appl. Phys., vol. 46, No. 7, p. 74001, 2013.
A. Goyal et al., Appl. Phys. Lett., vol. 69, No. 12, p. 1795-1797, 1996.

* cited by examiner

THREE-DIMENSIONAL MAGNETIC DEVICE AND MAGNETIC MEMORY

CROSS REFERENCE TO RELATED APPLICATION

This application claims the priority of a Chinese patent application No. 201910600144.3 filed on Jul. 4, 2019, the disclosure of which is incorporated herein by reference in its entirety.

BACKGROUND

Field of the Disclosure

The disclosure relates to devices and circuits and applications thereof having magnetic materials or structures, and in particular, to a three-dimensional magnetic device and its data writing mechanism based on spin Hall effect and a circuit thereof.

Description of Related Art

Magnetic random access memory (MRAM) has advantages of non-volatility, random access, low cost, high endurance (nearly unlimited reading and writing), wide operating temperature range and being radiation-harden (free from high-energy particle radiation interference).

The core storage unit of MRAM is a magnetic tunnel junction (MTJ). The MTJ is essentially consisted of a reference layer, a spacing layer, and a free layer. The reference layer and the free layer are generally made of ferromagnetic materials. The spacing layer is a non-magnetic insulator, also referred to as a tunneling barrier located between the reference layer and the free layer. The tunneling barrier is configured to enable the electrons to tunnel through the MTJ structure. The magnetization direction of the reference layer remains fixed, while that of the free layer may be changed. Data is written into the MTJ in a form of its magnetization state. When the magnetization directions of the free layer and the reference layer are parallel to each other, the MTJ presents a low resistance state, which is used to represent a binary state "1" in memory. On the other hand, when the magnetization directions of the free layer and the reference layer are antiparallel to each other, the MTJ presents a high resistance state, which is used to represent a binary state "0".

Spin-transfer-torque magnetic random access memory (STT-MRAM) exerts a spin transfer torque to reverse the magnetization of free layer to enable data writing. There are several disadvantages with respect to STT-MRAM. First, the critical writing current varies in inverse proportion to the writing time, and therefore a high-speed writing requires increasing the writing current, leading to high power consumption. Second, the writing current needs to pass through the tunneling barrier of the MTJ, which is likely to be broken down.

Considering the shortcomings of STT-MRAM, researchers have proposed to use a spin-orbit torque (SOT) to realize fast, reliable, and low-power-consumption magnetization reversal (L. Liu et al., *Science*, vol. 336, no. 6081, p. 555-558, 2012). This technology is based on the spin Hall effect in the heavy metal Ta which can be expressed as an equation $J_S=J_q\theta$, wherein $J_S$ is the spin-polarized current density, $J_q$ is the charge current density, and $\theta$ is the spin Hall angle. The charge current is composed of electrons with various spin orientations, and the number of electrons with different spin orientations in the charge current is equal to each other. The spin Hall angle reflects the spin conversion efficiency of the Ta layer (12%~15%). Both the writing current (charge current) and the spin-polarized current do not pass through the tunneling barrier, which avoids the risk that the tunneling barrier may be broken down.

Compared with heavy metals, a topological insulator (TI) has a higher spin conversion efficiency. Therefore, the writing current required for reversing the free layer magnetization may be smaller, thus further reduces power consumption. The spin conversion efficiency of the TI $(BiSb)_2Te_3$ at room temperature found by Wang Kanglong's research group is 266% (Q. Shao et al., 2018 *IEEE Int. Electron Devices Meet.*, p. 36.3.1-36.3.4, 2018), which provides more possibilities to develop new low-power-consumption MRAM based on SOT.

Since the heavy metal layer and each layer of the MTJ are parallel to the wafer substrate surface, occupying large areas, it is difficult to miniaturize the MTJ array and realize a high storage density for the conventional two-dimensional MRAM. According to the calculation equation of the thermal stability factor $$\Delta = \frac{KV}{k_BT} = \frac{KAt}{k_BT}$$

(A. V Khvalkovskiy et al., *J. Phys. D. Appl. Phys.*, vol. 46, no. 7, p. 74001, 2013), the scaling of a two-dimensional MTJ array has a limit, thus it is difficult to further improve the storage density of MRAM (A. Goyal et al., *Appl. Phys. Lett.*, vol. 69, no. 12, p. 1795-1797, 1996). For small technology nodes (<10 nm) of semiconductor CMOS process, the MTJ structure needs a new design in order to ensure thermal stability.

SUMMARY

In order to address the above-mentioned shortcomings existing in the prior art, one object of the present disclosure is to provide a three-dimensional magnetic device based on the spin Hall effect. The storage unit array of the three-dimensional magnetic device may not only be distributed on the plane of the wafer substrate, but also be disposed in the vertical direction of the plane of the wafer substrate. As a result, the storage density of the three-dimensional magnetic device can be improved several times while ensuring its thermal stability. It is proposed in the present disclosure to use a spin-orbit torque to reverse magnetization, wherein the reading and writing operations are separated and do not affect each other. In addition, it is proposed to use the spin-orbit torque and the spin transfer torque together to reverse magnetization, such that the critical writing current and therefore Joule heat dissipation may be reduced, and the reliability and the stability of the three-dimensional magnetic device may be improved.

A second object of the present disclosure is to provide an operation circuit based on the three-dimensional magnetic device. The operation circuit may promote the practical application of the three-dimensional magnetic device.

In one aspect, the present disclosure provides a three-dimensional magnetic device. The magnetic device comprises an internal electrode, at least one magnetic junction and at least one external electrode. Each of the at least one magnetic junction is configured to surround the outer surface of the internal electrode, and each of the at least one external electrode is configured to surround the outer surface of a corresponding one of the at least one magnetic junction.

The at least one magnetic junction is stacked in the direction perpendicular to the bottom surface of the internal electrode.

The internal electrode, the at least one magnetic junction and the at least one external electrode are formed to have columnar structures.

The writing mechanism of the three-dimensional magnetic device is based on the spin Hall effect.

Each of the at least one magnetic junction comprises a magnetic free layer, a magnetic reference layer and a non-magnetic spacing layer between the free layer and the reference layer. The free layer is in contact with the internal electrode, and the reference layer is in contact with a corresponding external electrode. The free layer is used for data storage.

In another aspect, the present disclosure provides a three-dimensional magnetic memory. The magnetic memory comprises the above-mentioned three-dimensional magnetic device and an operation circuit. The operation circuit comprises a first-electrical-terminal, a second-electrical-terminal, at least one third-electrical-terminal, and an operation module.

The first-electrical-terminal and the second-electrical-terminal are configured to be respectively connected to the two opposite ends of the internal electrode of the three-dimensional magnetic device, and each one of the at least one third-electrical-terminal is configured to be connected to the corresponding one of the at least one external electrode of the three-dimensional magnetic device. The first-electrical-terminal, the second-electrical-terminal and the at least one third-electrical-terminal are connected to the operation module. The operation module is used to switch and/or sense the resistance state of the selected one of the at least one magnetic junction of the three-dimensional magnetic device.

In one embodiment, the internal electrode is made of a heavy metal/metalloid or an alloy/compound thereof.

In one embodiment, the free layer of the magnetic junction is made of a ferromagnetic or ferrimagnetic metal or an alloy thereof.

In one embodiment, the free layer is made of a synthetic ferromagnetic or ferrimagnetic material.

In one embodiment, the free layer is made of a semi-metallic ferromagnetic material. The semi-metallic ferromagnetic material comprises a Heusler alloy in the form of XYZ or $X_2YZ$, wherein X, Y and Z are the constituent materials, the subscript(s) indicate the stoichiometric ratio of X, Y and Z.

In one embodiment, the free layer is made of a synthetic antiferromagnetic material. The free layer made of the synthetic antiferromagnetic material is consisted of ferromagnetic layers separated by non-magnetic metal layers.

In one embodiment, the spacing layer of the at least one magnetic junction is made of an oxide, nitride, or oxynitride material.

In one embodiment, the spacing layer is made of a metal or an alloy.

In one embodiment, the spacing layer is selected from, but not limited to, SiC or ceramic materials.

In one embodiment, the external electrode is made of a metal or an alloy.

In one embodiment, the magnetization of the free layer is in the normal direction of its surface.

In one embodiment, the magnetization of the free layer is in a tangent direction of its surface.

In one embodiment, the magnetization reversal of the free layer is achieved by at least a spin-orbit torque, which is provided by a spin-polarized current generated by a charge current flowing through the internal electrode.

In one embodiment, the magnetization reversal of the free layer is achieved by a combination of a spin-orbit torque and a spin transfer torque. The spin-orbit torque is provided by a spin-polarized current generated by a charge current, also referred to as first writing current, flowing through the internal electrode, and the spin transfer torque is provided by injecting a second writing current along the radial direction of the annular cross section of the at least one magnetic junction. The second writing current is charge current.

In one embodiment, the resistance state of the at least one magnetic junction is determined by injecting a reading current along the radial direction of the annular cross section of the at least one magnetic junction. The reading current is charge current.

The present disclosure has the following beneficial effects:

The storage unit array may not only be formed on the plane of the wafer substrate, but also be disposed in the vertical direction of the plane of the wafer substrate, thus the storage density can be improved several times.

The magnetic junction has a columnar structure extending in the perpendicular direction of the wafer substrate, which can increase the volume of the free layer, and thus increase the thermal stability factor $\Delta$.

For the magnetic junction with a columnar structure, its extension in the perpendicular direction of the wafer substrate as mentioned above does not affect the required spin-polarized current density $J_S$. Also it can be inferred that, since $\theta=J_S/J_q$, the required charge current density $J_q$ (critical writing current density) will not increase. Therefore, the power consumption will not increase.

It is proposed to use a spin-orbit torque to reverse the magnetization. In this way, the writing current only goes through the internal electrode which is adjacent to the free layer, while the reading current goes through the magnetic junction in order to sense its resistance state, so the reading and writing operations are separated and do not affect each other. Or, a spin-orbit torque and a spin transfer torque are used together to reverse the magnetization, such that the critical writing current and therefore Joule heat dissipation may be reduced, and the reliability and the stability of the three-dimensional magnetic device may be improved.

At present, cylindrical internal electrodes can be produced with convenient and streamlined technique in the semiconductor industry. Therefore, the present disclosure has wide industrial applicability.

DETAILED DESCRIPTION

Figure 1A:
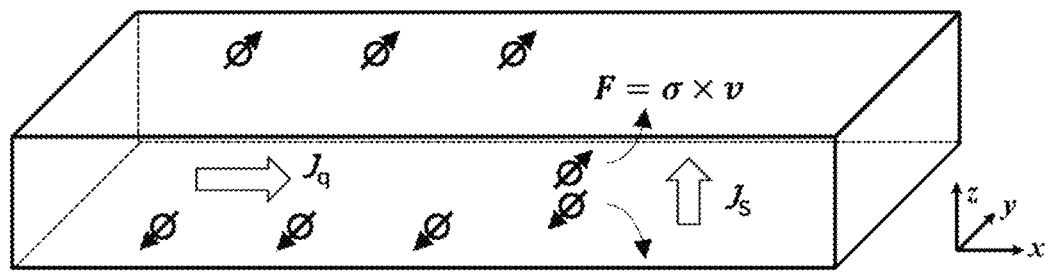
FIG. 1A shows the spin Hall effect in a heavy metal material.

FIG. 1A shows the spin Hall effect in a heavy metal material. When a charge current is introduced in the x direction, a spin-polarized current can be generated in the z direction.

Figure 1B:
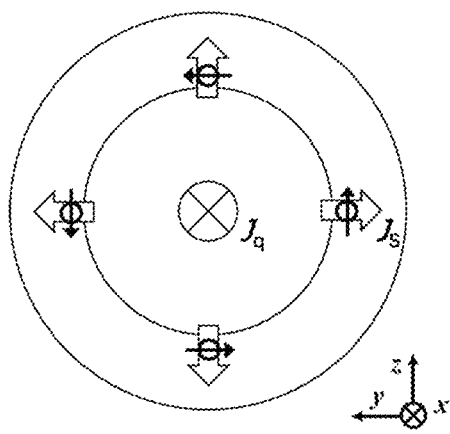
FIG. 1B shows the spin Hall effect in a heavy metal material with a columnar structure and a circular cross section, the outer surface of which is coated with a layer of ferromagnetic material.

FIG. 1B shows the spin Hall effect in a heavy metal material with a columnar structure and a circular cross section, which is coated with a layer of ferromagnetic material on the outer surface. When a charge current is introduced along the x direction into the heavy metal material, a spin-polarized current can be generated in the radial direction. The polarization of the spin-polarized current is oriented clockwise or counterclockwise along the tangent line. After spin-polarized electrons diffuse into the adjacent ferromagnetic layer, the electrons exchange spin angular momentum with the ferromagnetic layer, such that the magnetization of the ferromagnetic layer may be oriented clockwise or counterclockwise according to the selection.

Figure 1C:
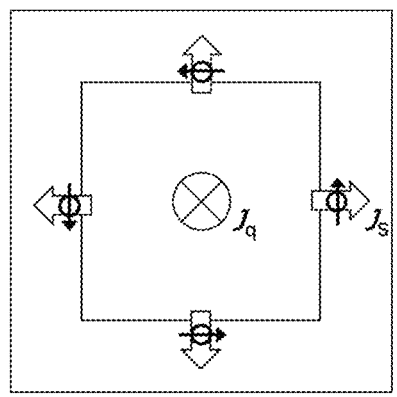
FIG. 1C shows the spin Hall effect in a heavy metal material with a columnar structure and a square cross section, the outer surface of which is coated with a layer of ferromagnetic material.

FIG. 1C shows the spin Hall effect in a heavy metal material with a columnar structure and a square cross section, which is coated with a layer of ferromagnetic material on the outer surface. If we introduce a charge current along the x direction into the heavy metal material, the spin polarization and flow direction of the resulting spin-polarized current, and its effect on the magnetization of the adjacent ferromagnetic layer, can be inferred in the same way as used in FIG. 1A and FIG. 1B.

In the following, the three-dimensional magnetic device and magnetic memory proposed by the present disclosure will be described in view of a cylindrical structure as shown in, for example, FIG. 1B. The following composition, structures, materials, manufacturing processes, reading and writing manners depicted are also applicable to the columnar structure with a square cross section as shown in FIG. 1C which can be made into the three-dimensional magnetic device and magnetic memory.

Figure 2A:
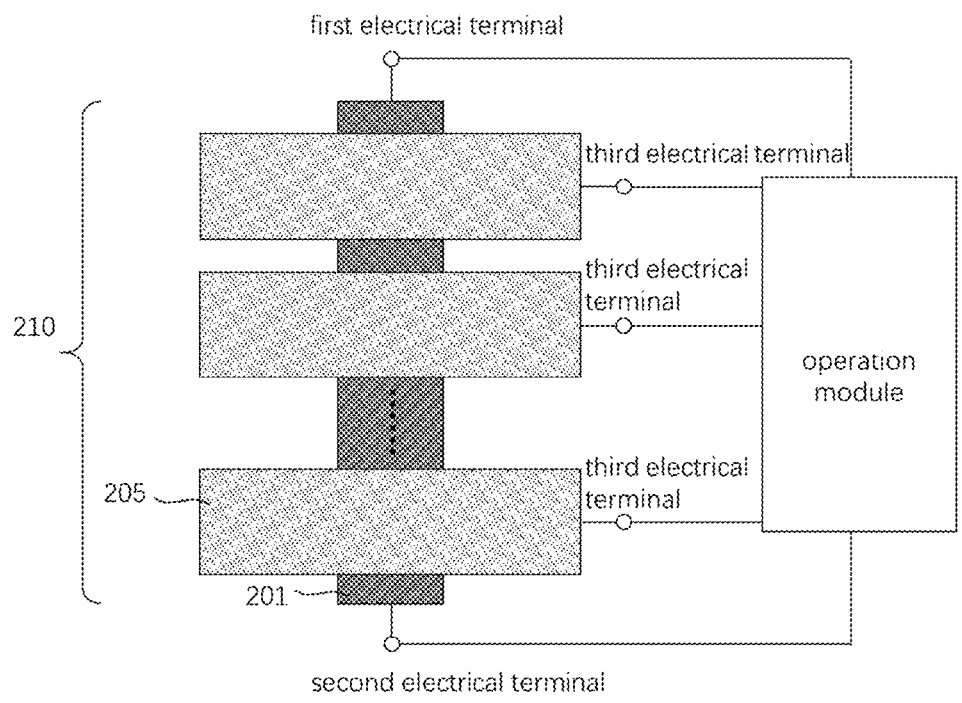
FIG. 2A shows a three-dimensional magnetic memory according to an embodiment of the present disclosure.

FIG. 2A shows a three-dimensional magnetic memory according to an embodiment of the present disclosure. The memory includes, as represented in block diagram form, a three-dimensional magnetic device 210, a first-electrical-terminal, a second-electrical-terminal, at least one third-electrical-terminal, and an operation module.

Figure 2B:
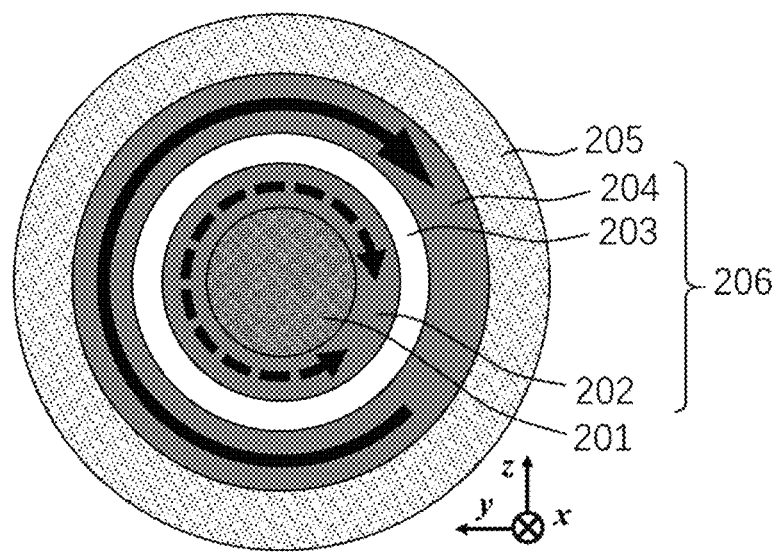
FIGS. 2B and 2C show a front view and a top view of the three-dimensional magnetic device 210 shown in FIG. 2A, respectively.
Figure 2C:
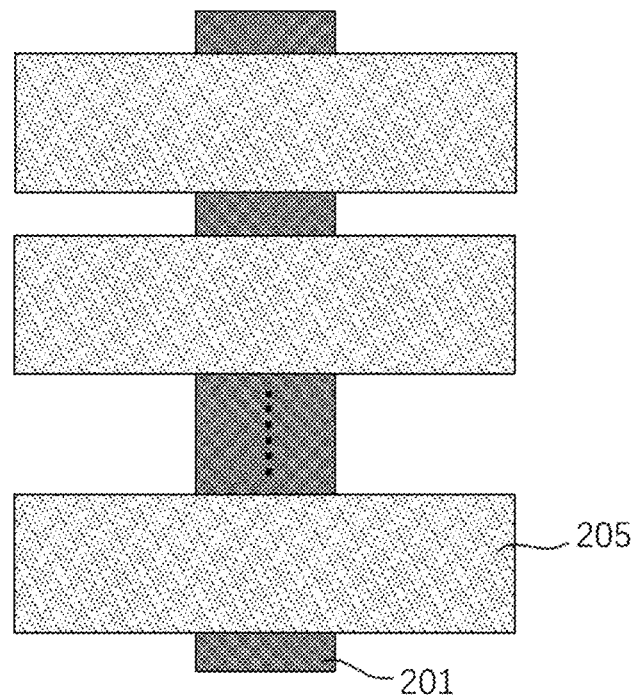

FIGS. 2B and 2C show a front view and a top view of the three-dimensional magnetic device 210, respectively. As shown in FIG. 2B, the magnetic device is of a columnar structure including an internal electrode 201, at least one magnetic junction 206, and at least one external electrode 205. The internal electrode 201 is shared by the at least one magnetic junction 206. Each of the at least one magnetic junction 206 includes a magnetic free layer 202, a magnetic reference layer 204, and a non-magnetic spacing layer 203 positioned between the free layer 202 and the reference layer 204. Both ends of the internal electrode 201 are respectively provided with a first-electrical-terminal and a second-electrical-terminal. Each of the at least one external electrode 205 is connected to a corresponding one of the at least one third-electrical-terminal. The first-electrical-terminal, the second-electrical-terminal, and the at least one third-electrical-terminal are connected to the operation module.

For the three-dimensional magnetic memory shown in FIG. 2A, the operations of data reading and writing are as follows.

To realize the magnetization reversal of the free layer 202 of one selected magnetic junction in the at least one magnetic junction 206, the operation module injects a charge current, also referred to as first writing current, into the internal electrode 201 through the first-electrical-terminal and the second-electrical-terminal. Meanwhile, the operation module injects a second writing current into the selected magnetic junction in the at least one magnetic junction 206 through one corresponding third-electrical-terminal of the at least one third-electrical-terminal and the second-electrical-terminal. The second writing current is charge current.

When a reading current is injected into one selected magnetic junction in the at least one magnetic junction 206 through one corresponding third-electrical-terminal of the at least one third-electrical-terminal and the second-electrical-terminal, the resistance state of the selected magnetic junction in the at least one magnetic junction 206 can be sensed. The reading current is charge current.

Figure 3A:
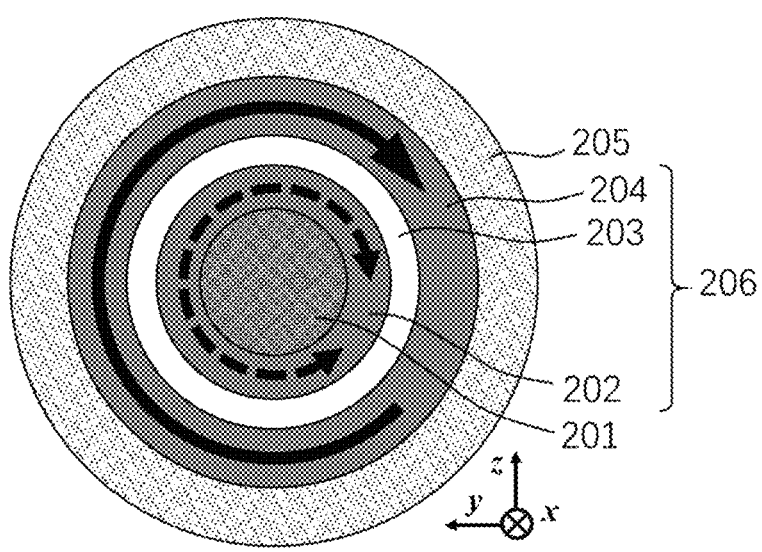
FIG. 3A and FIG. 3B show a front view and a top view of a storage unit of the three-dimensional magnetic memory shown in FIG. 2A, respectively.

FIG. 3A shows a storage unit of the three-dimensional magnetic memory shown in FIG. 2A. The storage unit has a columnar structure including an internal electrode 201, a magnetic junction 206, and an external electrode 205.

In some embodiments, the magnetic junction 206 may be stacked in the normal direction of the bottom surface of the internal electrode 201. In one embodiment, the magnetic junction 206 includes a magnetic free layer 202, a magnetic reference layer 204, and a non-magnetic spacing layer 203 positioned between the free layer 202 and the reference layer 204. The free layer 202 is used for data storage. In another embodiment, the magnetic junction 206 further includes a pinning layer for fixing the magnetization direction of the reference layer 204. In another embodiment, the magnetization direction of the reference layer 204 may be fixed in other manners. The storage unit shown in FIG. 3A may further include a selection device, such as a transistor, and other magnetic junctions.

In one embodiment, the magnetization orientation of the free layer 202 is in-plane, i.e., it is in a clockwise or counterclockwise direction along the tangent direction of the annular section of the free layer 202. In another embodiment, the magnetization orientation of the free layer 202 is out-of-plane, i.e., it is outward or inward along the radial direction of the annular section of the free layer 202.

In the present embodiment, the internal electrode 201 is directly in contact with the free layer 202.

In the present embodiment, the external electrode 205 is directly in contact with the reference layer 204.

In some embodiments, the internal electrode 201 is made of a heavy metal/metalloid or an alloy/compound thereof.

In some embodiments, the free layer 202 is made of a ferromagnetic or ferrimagnetic metal or an alloy thereof.

In other embodiments, the free layer 202 is made of a synthetic ferromagnetic or ferrimagnetic material.

In other embodiments, the free layer 202 is made of a semi-metallic ferromagnetic material. The semi-metallic ferromagnetic material comprises a Heusler alloy in the form of XYZ or $X_2YZ$, wherein X, Y and Z are the constituent materials, the subscript(s) indicate the stoichiometric ratio of X, Y and Z.

In other embodiments, the free layer 202 is made of a synthetic antiferromagnetic material. The free layer 202 made of a synthetic antiferromagnetic material is consisted of ferromagnetic layers separated by non-magnetic metal layers.

In some embodiments, the spacing layer 203 is made of an oxide, nitride, or oxynitride material.

In other embodiments, the spacing layer 203 is made of a metal or an alloy.

In other embodiments, the spacing layer 203 is selected from, but not limited to, SiC or ceramic materials.

In the present embodiment, the external electrode 205 is made of a metal or an alloy.

In the following, the manufacturing process of the storage unit shown in FIG. 3A will be described in the context of the internal electrode 201 being Ta and the free layer 202 being CoFeB. The manufacturing technology and process described below are also applicable to the storage unit shown in FIG. 3A made of other materials.

For the purpose of growing the internal electrode 201, a layer of Ta is grown by atomic layer deposition, magnetron sputtering deposition, or sub-atmospheric chemical vapor deposition, then ion beam etching or electron beam lithography is performed so as to obtain the internal electrode 201 with a columnar structure.

In other embodiments, the internal electrode 201 may be prepared as follows: first, a layer of insulating material is grown by atomic layer deposition, magnetron sputtering deposition or sub-atmospheric chemical vapor deposition, then a groove is etched on the insulating material layer by ion beam etching or electron beam lithography. The groove is then filled with Ta by atomic layer deposition, magnetron sputtering deposition, or sub-atmospheric chemical vapor deposition. Finally, the insulating material around Ta is etched away by ion beam etching or electron beam lithography so as to obtain the internal electrode 201 with a columnar structure.

After the preparation of the internal electrode 201 is completed, a layer of CoFeB is grown by atomic layer deposition, magnetron sputtering deposition or sub-atmospheric chemical vapor deposition, on the outer surface of the internal electrode 201 serving as the substrate, then a free layer 202 with a columnar structure having an annular cross section is obtained by using ion beam etching or electron beam lithography.

The manufacturing processes of the spacing layer 203, the reference layer 204, and the external electrode 205 are similar to that of the free layer 202.

Figure 3B:
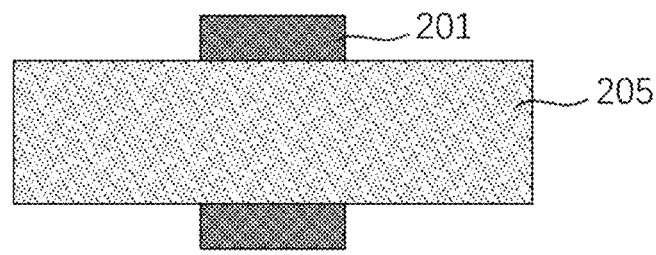

FIG. 3B shows a top view of the storage unit shown in FIG. 3A.

The reading and writing manners of the storage unit shown in FIG. 3A are given below.

Figure 4A:
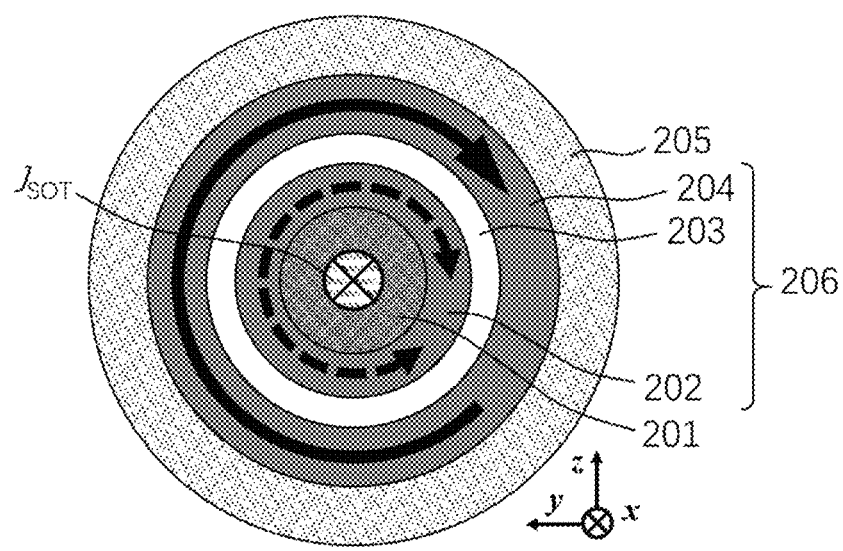
FIG. 4A and FIG. 4B show a front view and a top view of a writing manner of the storage unit shown in FIG. 3A, respectively.

In some embodiments, magnetization reversal of the free layer 202 is achieved by at least a spin-orbit torque. As shown in FIG. 4A, the spin-orbit torque is provided by supplying a charge current with current density $J_{SOT}$ to the internal electrode 201 along the normal direction of the circular cross section of the internal electrode 201, so as to reverse the magnetization of the free layer 202.

Figure 4B:
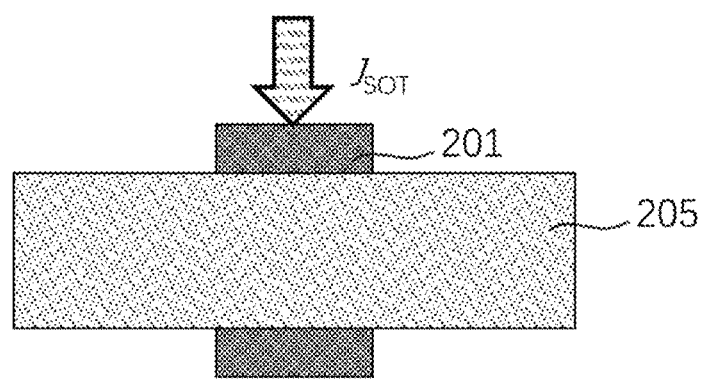

FIG. 4B shows a top view of the writing manner shown in FIG. 4A.

Figure 5A:
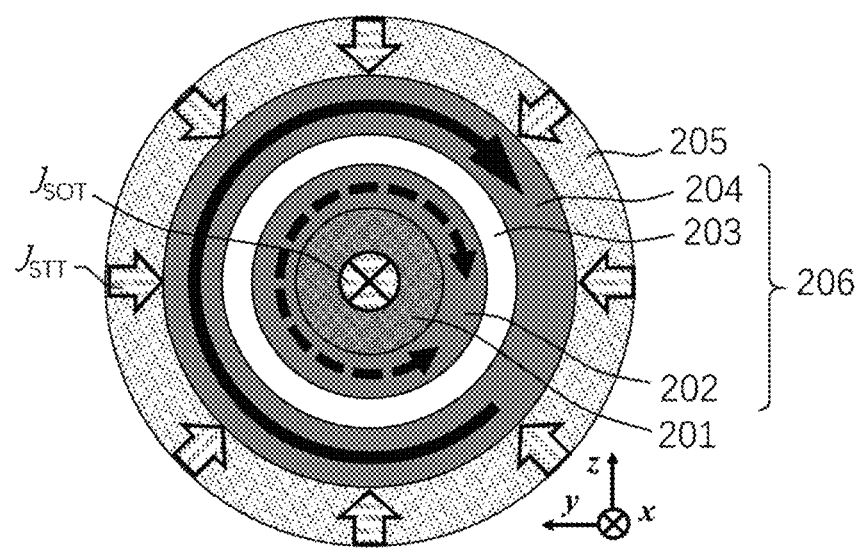
FIG. 5A and FIG. 5B show a front view and a top view of another writing manner of the storage unit shown in FIG. 3A, respectively.

In other embodiments, the magnetization reversal of the free layer 202 is achieved by a combination of a spin-orbit torque and a spin transfer torque. As shown in FIG. 5A, the spin-orbit torque is provided by supplying a charge current, also referred to as first writing current, with current density $J_{SOT}$ to the internal electrode 201 along the normal direction of the circular cross section of the internal electrode 201. Meanwhile, a second writing current with current density $J_{STT}$ is injected into the magnetic junction 206 along the radial direction of the annular cross section of the magnetic junction 206 to provide a spin transfer torque. The second writing current is charge current. The magnetization of the free layer 202 is reversed by the combination of the spin-orbit torque and the spin transfer torque.

Figure 5B:
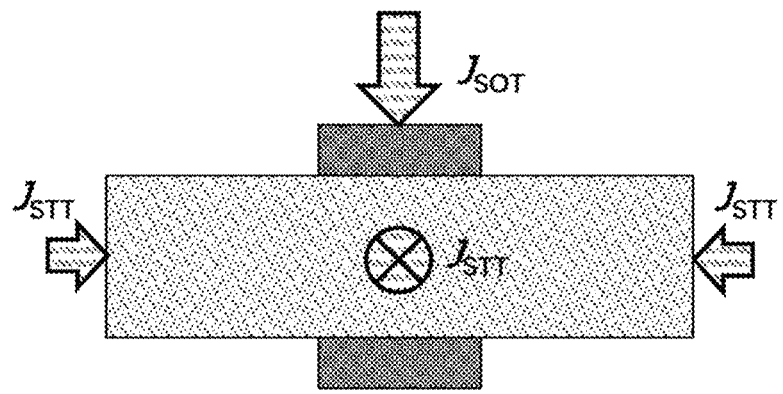

FIG. 5B is a top view of the writing manner shown in FIG. 5A.

Figure 6A:
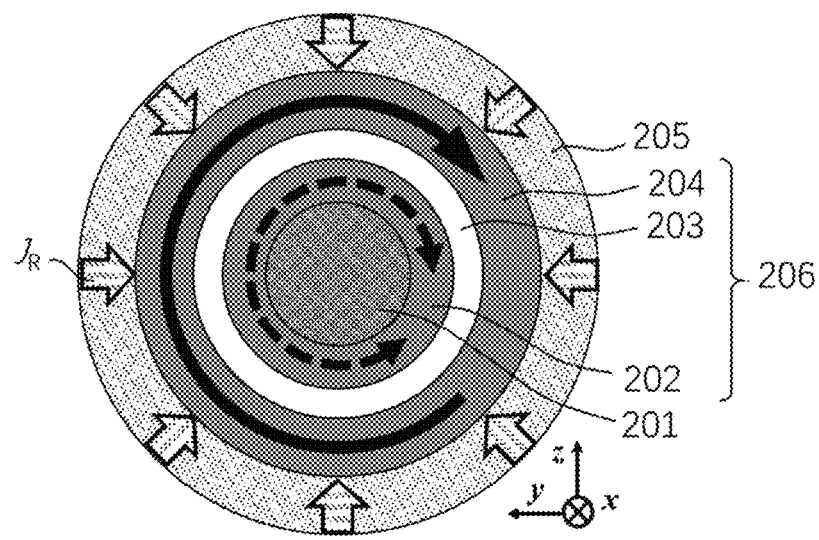
FIG. 6A and FIG. 6B show a front view and a top view of a reading manner of the storage unit shown in FIG. 3A, respectively.

FIG. 6A shows the reading manner of the storage unit shown in FIG. 3A. The determination of the resistance state of the magnetic junction 206 is achieved by injecting a reading current with current density $J_R$ into the magnetic junction 206 along the radial direction of the annular cross section of the magnetic junction 206. The reading current is charge current.

Figure 6B:
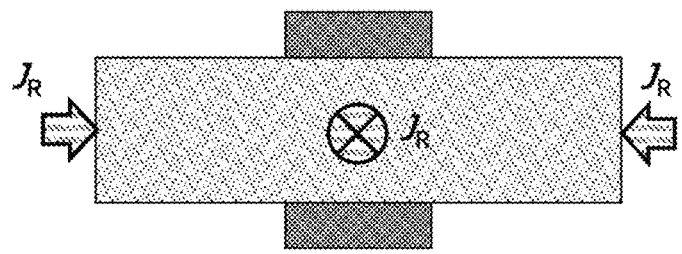

FIG. 6B is a top view of the reading manner shown in FIG. 6A.

Figure 7:
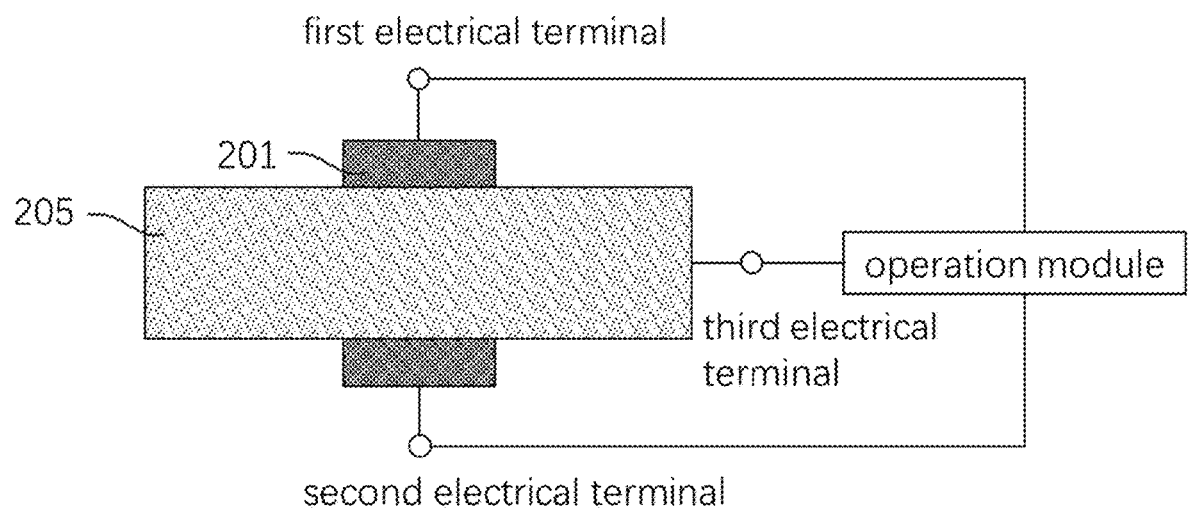
FIG. 7 shows a control circuit including the storage unit shown in FIG. 3B.

FIG. 7 shows a control circuit of the storage unit shown in FIG. 3B, represented in a block diagram form. The control circuit includes a storage unit as shown in FIG. 3B, a first-electrical-terminal, a second-electrical-terminal, a third-electrical-terminal, and a operation module. Both ends of the internal electrode 201 of the storage unit shown in FIG. 3B are respectively provided with the first-electrical-terminal and the second-electrical-terminal, and the external electrode 205 of the storage unit shown in FIG. 3B is provided with the third-electrical-terminal. The first-electrical-terminal, the second-electrical-terminal, and the third-electrical-terminal are connected to the operation module.

In some embodiments, the magnetization reversal of the free layer 202 in FIG. 3B is achieved by the operation module injecting a charge current into the internal electrode 201 through the first-electrical-terminal and the second-electrical-terminal. In other embodiments, the magnetization reversal of the free layer 202 is achieved by the operation module injecting a charge current, also referred to as first writing current, into the internal electrode 201 through the first-electrical-terminal and second-electrical-terminal and at the same time injecting a second writing current into the magnetic junction 206 in FIG. 3B through the second-electrical-terminal and the third-electrical-terminal. The second writing current is charge current.

The determination of the resistance state of the magnetic junction 206 in FIG. 3B is achieved by the operation module injecting a reading current into the magnetic junction 206 through the second-electrical-terminal and the third-electrical-terminal. The reading current is charge current.

In the following, the reading and writing principles of the three-dimensional magnetic device 210 shown in FIG. 2A will be described in more detail.

Figure 8A:
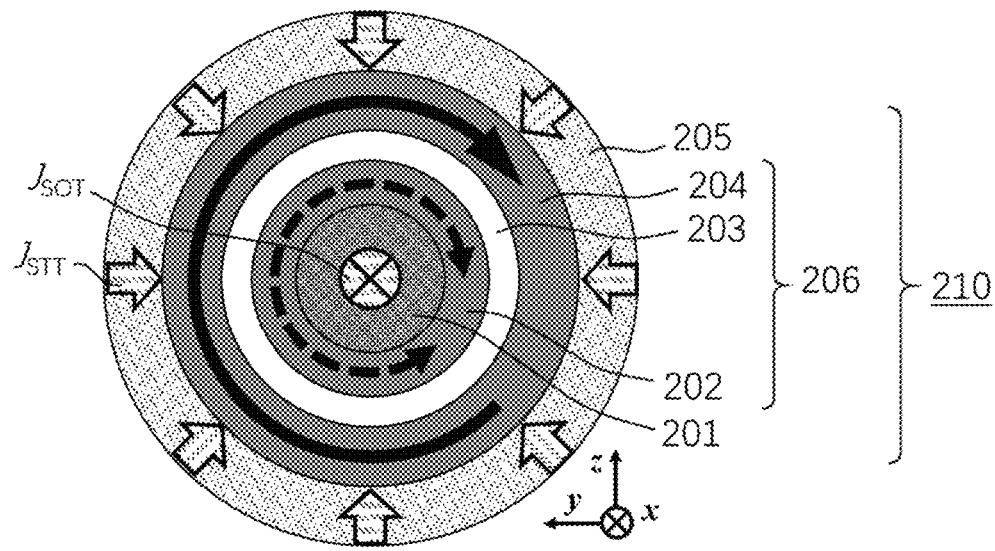
FIG. 8A and FIG. 8B show a front view and a top view of a writing manner of the three-dimensional magnetic device 210 shown in FIG. 2A, respectively.

In the present embodiment, the magnetization reversal of the free layer 202 of one selected magnetic junction in the at least one magnetic junction 206 is achieved by a combination of a spin-orbit torque and a spin transfer torque. As shown in FIG. 8A, the spin-orbit torque is provided by supplying a charge current, also referred to as first writing current, with current density $J_{SOT}$ to the internal electrode 201 along the normal direction of the circular cross section of the internal electrode 201. Meanwhile, a second writing current with current density $J_{STT}$ is injected into the selected magnetic junction in the at least one magnetic junction 206 along the radial direction of the annular cross section of the selected magnetic junction in the at least one magnetic junction 206 to provide a spin transfer torque. The second writing current is charge current. The magnetization of the free layer 202 of the selected magnetic junction in the at least one magnetic junction 206 is reversed by the combination of the spin-orbit torque and the spin transfer torque.

Figure 8B:
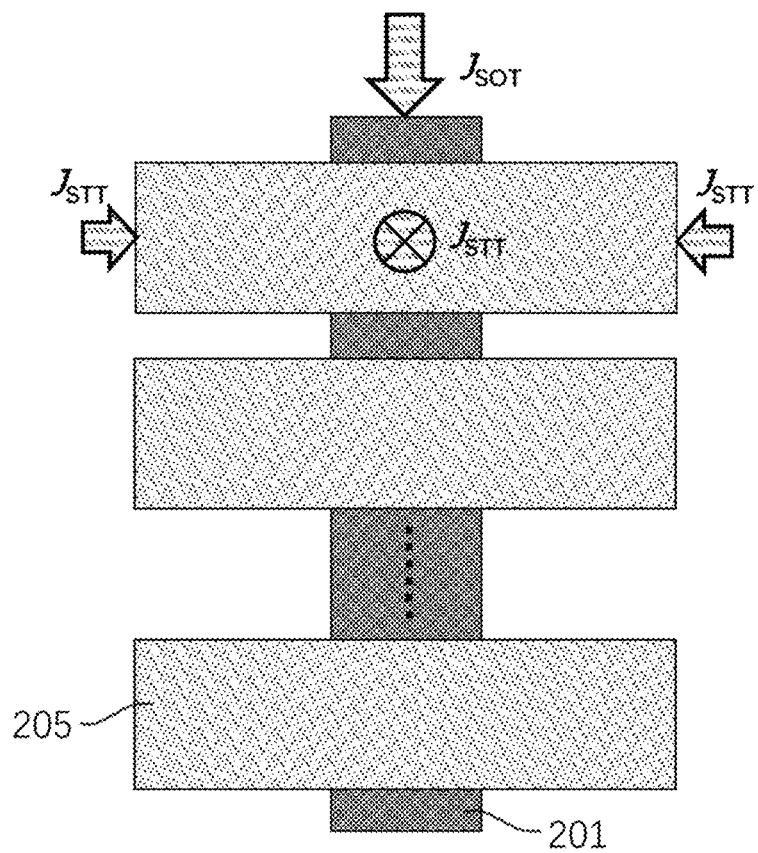

FIG. 8B shows a top view of the writing manner shown in FIG. 8A.

Figure 9A:
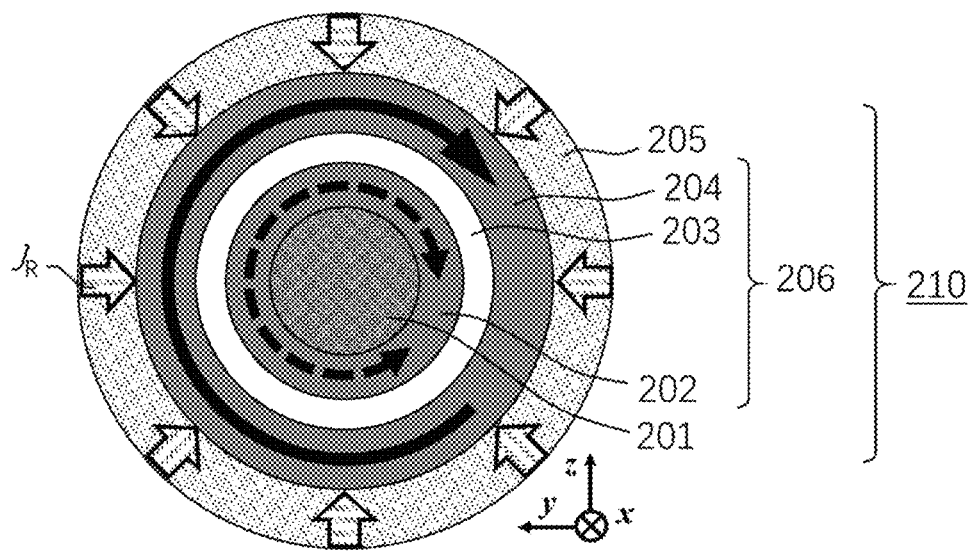
FIG. 9A and FIG. 9B show a front view and a top view of a reading manner of the three-dimensional magnetic device 210 shown in FIG. 2A, respectively.

FIG. 9A shows a reading manner of the three-dimensional magnetic device 210 shown in FIG. 2A. By injecting a reading current with current density $J_R$ into one selected magnetic junction in the at least one magnetic junction 206 along the radial direction of the annular cross section of the selected magnetic junction in the at least one magnetic junction 206, the resistance state of the selected magnetic junction in the at least one magnetic junction 206 can be determined. The reading current is charge current.

Figure 9B:
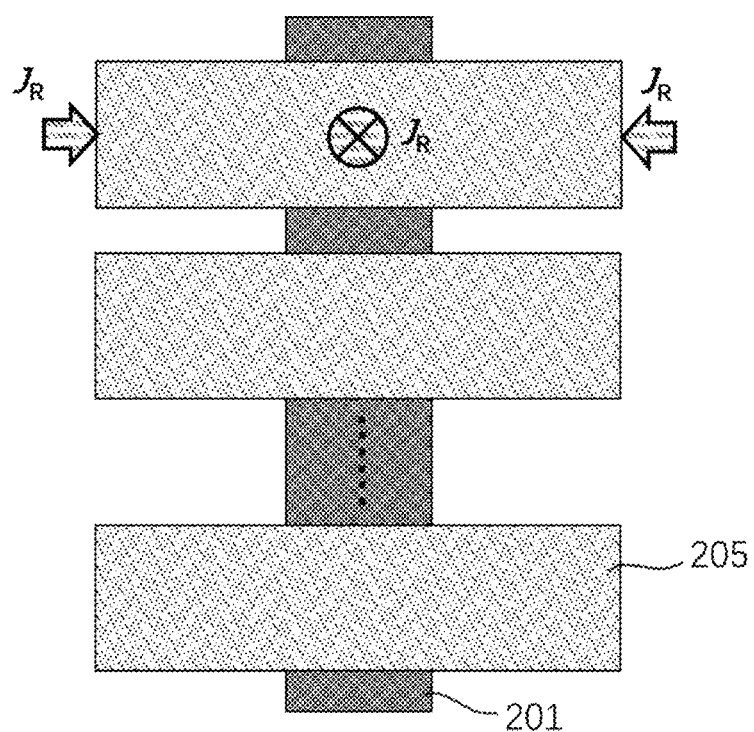

FIG. 9B shows a top view of the reading manner shown in FIG. 9A.

Figure 10A:
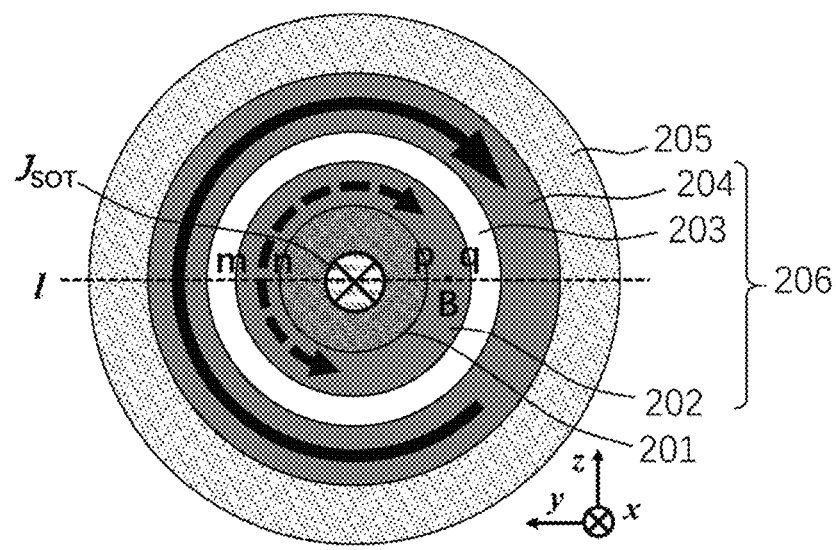
FIG. 10A shows a micromagnetic model based on the writing manner shown in FIG. 4A, and FIG. 10B and FIG. 10C show the micromagnetic simulation results.

FIG. 10A shows a micromagnetic model of the free layer 202 based on the writing manner shown in FIG. 4A. The free layer 202 is made of Co, and has an inner diameter of 20 nm, an outer diameter of 40 nm, and a length in the x direction of 10 nm. The relationship between the spin-polarized current density $J_S$ and the charge current density $J_{SOT}$ is $J_S = J_{SOT} \theta e^{-r/\lambda}$, wherein the spin Hall angle $\theta$ may be 0.08, r is the distance from a point on the annular cross section of the free layer 202 to the center of the circle, $\lambda$ is the spin diffusion length and at room temperature $\lambda$ may be 38 nm. The initial magnetization of the free layer 202 is oriented counterclockwise.

Figure 10B:
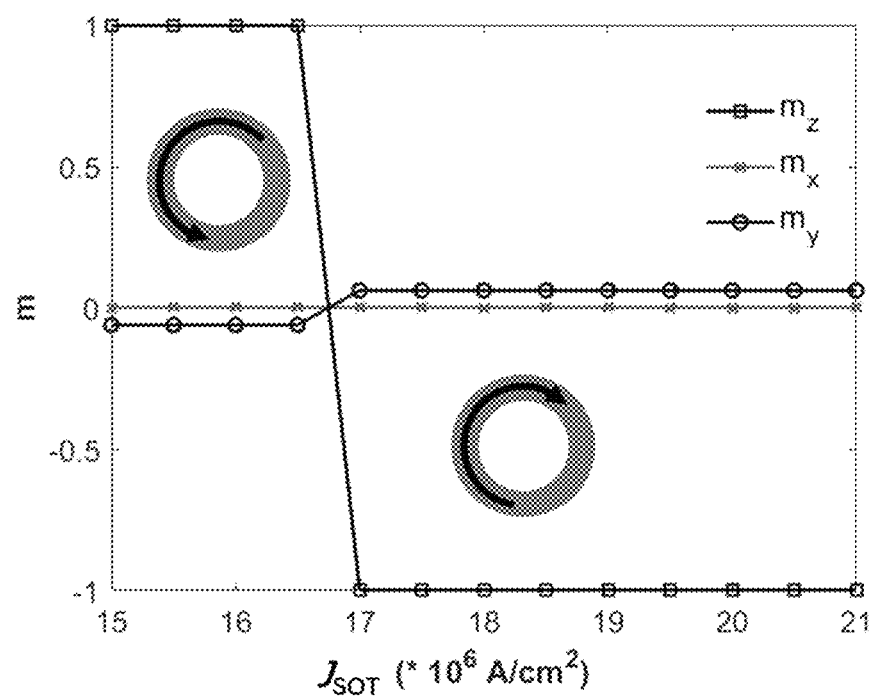

FIG. 10B shows the micromagnetic simulation results depicting how the final magnetization at point B in the free layer 202 varies with charge current density $J_{SOT}$, based on the micromagnetic model shown in FIG. 10A. It can be seen that the charge current density required for magnetization reversal (critical writing current density) is $J_{SOT,C} = 1.7 \times 10^7$ A/cm². When $J_{SOT} > J_{SOT,C}$, the final magnetization of the free layer 202 changes from counterclockwise direction to clockwise direction.

Figure 10C:
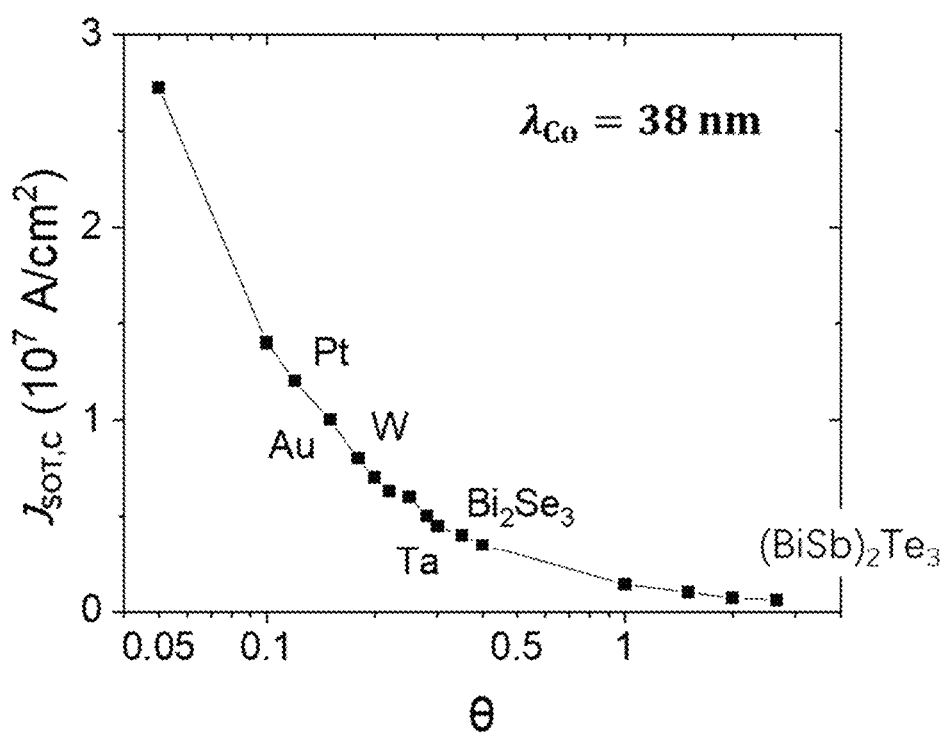

FIG. 10C shows the micromagnetic simulation results depicting how the critical writing current density $J_{SOT,C}$ varies with the spin Hall angle $\theta$, based on the micromagnetic model shown in FIG. 10A. It can be seen that $J_{SOT,C}$ decreases as $\theta$ increases. When $\theta$ is large enough (e.g., $\theta > 0.3$), $J_{SOT,C}$ may reach below $0.5 \times 10^7$ A/cm², which is expected to greatly reduce the power consumption of writing operation and improve the reliability and stability of the three-dimensional magnetic device and magnetic memory made from it.

What is claimed is:

1. A three-dimensional magnetic memory, comprising:
a three-dimensional magnetic device including an internal electrode with a columnar structure, at least one magnetic junction with a columnar structure configured to surround the internal electrode; and at least one external electrode with a columnar structure; and
an operation circuit including a first-electrical-terminal configured to be provided on one end of the internal electrode, a second-electrical-terminal configured to be provided on an opposite end of the internal electrode, at least one third-electrical-terminal, and an operation module,
wherein each one of the at least one external electrode is configured to surround a corresponding one of the at least one magnetic junction,
wherein the at least one magnetic junction is stacked in a direction perpendicular to the bottom surface of the internal electrode,
wherein each of the at least one magnetic junction includes: a magnetic free layer configured to be in contact with the internal electrode and used for data storage; a magnetic reference layer configured to be in contact with a corresponding one of the at least one external electrode; and a non-magnetic spacing layer between the magnetic free layer and the magnetic reference layer,
wherein each of the at least one third-electrical-terminal is configured to be connected to a corresponding one of the at least one external electrode,
wherein the first-electrical-terminal, the second-electrical-terminal and the at least one third-electrical-terminal are connected to the operation module, and the operation module is used to switch and/or sense a resistance state of the at least one magnetic junction of the three-dimensional magnetic device.

2. The three-dimensional magnetic memory of claim 1, wherein the internal electrode is made of a heavy metal/metalloid or an alloy/compound thereof, including one or more of Nb, Ta, Cr, Mo, W, Re, Ru, Os, Ir, Pd, Pt, Au, Cd, Hg, B, Tl, Sn, Pb, Sb, Bi, Se, Te, Cl, Sm, TaN, WN, $Sb_2Te_3$, BiSb, $Bi_2Se_3$, $Bi_2Te_3$, $(BiSb)_2Te_3$, HgTe, BiSe, $(Bi_{0.57}Sb_{0.43})_2Te_3$, $TlBiSe_2$, $Bi_{1.5}Sb_{0.5}Te_{1.8}Se_{1.2}$, SnTe, $Bi_{2-x}Cr_xSe_3$, $SmB_6$, BiTeCl, HgTe/CdTe.

3. The three-dimensional magnetic memory of claim 1, wherein the magnetic free layer in each of the at least one magnetic junction is made of a ferromagnetic or ferrimagnetic material or the alloy thereof, including one or more of Fe, Co, Ni, Mn, FeCo, FeNi, FePd, FePt, CoPd, CoPt, YCo, LaCo, PrCo, NdCo, SmCo, MnBi, CoFeB or MnNiSb, and a combination thereof with one or more materials selected from B, Al, Zr, Hf, Nb, Ta, Cr, Mo, Pd or Pt;

or the magnetic free layer is made of a synthetic ferromagnetic or ferrimagnetic material with a laminated structure of 3d, 4d, 4f, 5d, 5f, or rare earth metals, wherein the laminated structure is selected from, but not limited to, Co/Ir, Co/Pd, Co/Pt, Co/Au, Co/Ni or CrCo/Pt;

or the magnetic free layer is made of a semi-metallic ferromagnetic material including a Heusler alloy in a form of XYZ or $X_2YZ$, wherein X is selected from one or more of Mn, Fe, Co, Ni, Pd, or Cu, Y is selected from one or more of Ti, V, Cr, Mn, Fe, Co, or Ni, and Z is selected from one or more of Al, Ga, In, Si, Ge, Sn, or Sb;

or the magnetic free layer is made of a synthetic antiferromagnetic material, which is formed by ferromagnetic layers separated by non-magnetic metal layers, wherein each of the ferromagnetic layers of the magnetic free layer is selected from, but not limited to, one or more of Fe, Co, Ni, FeCo, CrCoPt, or CoFeB, or one of laminated structures of $(Co/Ni)_p$, $(Co/Pd)_m$, or $(Co/Pt)_n$, wherein m, n, p refer to the numbers of lamination layers; and the non-magnetic metal layer of the magnetic free layer is selected from one or more of Nb, Ta, Cr, Mo, W, Re, Ru, Os, Rh, Ir, Pt, Cu, Ag, or Au.

4. The three-dimensional magnetic memory of claim 1, wherein the non-magnetic spacing layer of each of the at least one magnetic junction is made of an oxide, a nitride, or an oxynitride selected from one or more of Mg, B, Al, Ca, Sr, La, Ti, Hf, V, Ta, Cr, W, Ru, Cu, In, Si or Eu in combination with one or more of N, or O;
   or the non-magnetic spacing layer is made of a metal or an alloy selected from one or more of Mg, Al, Cu, Ag, Au, Y, Ti, V, Nb, Ta, Cr, Mo, W, Ru, Os, Rh, Pd or Pt;
   or the non-magnetic spacing layer is made of SiC or a ceramic material.

5. The three-dimensional magnetic memory of claim 1, wherein each of the at least one external electrode is made of a metal or an alloy selected from one or more of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm or Yb.

6. The three-dimensional magnetic memory of claim 1, wherein the magnetization of the magnetic free layer in each of the at least one magnetic junction is in a normal direction of the surface of the magnetic free layer;
   or the magnetization of the magnetic free layer is in a tangent direction of the surface of the magnetic free layer.

7. The three-dimensional magnetic memory of claim 1, wherein the magnetization reversal of the magnetic free layer in a selected one of the at least one magnetic junction is achieved by at least a spin-orbit torque provided by a spin-polarized current generated by a charge current flowing through the internal electrode; when no electrical current flows through the internal electrode, no spin-polarized current is generated.

8. The three-dimensional magnetic memory of claim 1, wherein the magnetization reversal of the magnetic free layer in a selected one of the at least one magnetic junction is achieved by a combination of a spin-orbit torque and a spin transfer torque, the spin-orbit torque being provided by a spin-polarized current generated by a charge current, referred to as first writing current, flowing through the internal electrode, and the spin transfer torque being provided by injecting a second writing current along the radial direction of the annular cross section of the selected one of the at least one magnetic junction.

9. The three-dimensional magnetic memory of claim 1, wherein the resistance state of a selected one of the at least one magnetic junction is a low resistance state or a high resistance state, and a determination of the resistance state is achieved by injecting a reading current along the radial direction of the annular cross section of the selected one of the at least one magnetic junction.

* * * * *